US 11,626,860 B2

(12) United States Patent
Hill et al.

(10) Patent No.: US 11,626,860 B2
(45) Date of Patent: Apr. 11, 2023

(54) RECEIVER

(71) Applicant: Kirintec Limited, Ross on Wye (GB)

(72) Inventors: Paul Hill, Ross on Wye (GB); Lee Michael Pomeroy, Highnam (GB); Richard Harrison, Ross on Wye (GB)

(73) Assignee: KIRINTEC LIMITED, Herefordhire (GB)

( * ) Notice: Subject to any disclaimer, the term of this patent is extended or adjusted under 35 U.S.C. 154(b) by 0 days.

(21) Appl. No.: 16/960,109

(22) PCT Filed: Jan. 4, 2019

(86) PCT No.: PCT/GB2019/050027
§ 371 (c)(1),
(2) Date: Jul. 6, 2020

(87) PCT Pub. No.: WO2019/135089
PCT Pub. Date: Jul. 11, 2019

(65) Prior Publication Data
US 2021/0075403 A1 Mar. 11, 2021

(30) Foreign Application Priority Data
Jan. 5, 2018 (GB) ...................................... 1800174

(51) Int. Cl.
*H03J 7/18* (2006.01)
*H03B 5/06* (2006.01)
(Continued)

(52) U.S. Cl.
CPC .................. *H03J 7/18* (2013.01); *H03B 5/06* (2013.01); *H04B 1/0007* (2013.01); *H04B 1/18* (2013.01);
(Continued)

(58) Field of Classification Search
CPC ............ H03B 21/02; H03B 2201/0208; H03B 2202/027; H03B 5/06; H03J 1/005; H03J 7/065; H03J 7/10; H03J 7/18
(Continued)

(56) References Cited

U.S. PATENT DOCUMENTS 5,774,195 A * 6/1998 Miyahara ......... H04N 21/44209
455/142
5,797,087 A 8/1998 Lee
(Continued)

FOREIGN PATENT DOCUMENTS

| GB | 1372576 A | 10/1974 |
| JP | H01101723 A | 4/1989 |

(Continued)

*Primary Examiner* — Aji A Akinyemi
(74) *Attorney, Agent, or Firm* — DeLio Peterson & Curcio LLC; Brian G. Schlosser

(57) ABSTRACT

A receiver and associated methods are described. The receiver comprises a first oscillator 14, a second oscillator 16, a controller 18 operable to control frequencies to which the first and second oscillators are tuned, and a discrimination circuit 24 operable to receive and monitor transmitted signals; wherein the discrimination circuit is configured to receive a signal at a first transmission frequency determined based on a first tuned frequency to which the first oscillator is tuned, and to determine, in a capture time period, whether data is being transmitted at the first transmission frequency; wherein the controller is configured to tune, in a tuning time period, the second oscillator to a second tuned frequency; and wherein the tuning time period is shorter than the capture time period.

8 Claims, 2 Drawing Sheets

(51) Int. Cl.
  *H04B 1/00* (2006.01)
  *H04B 1/18* (2006.01)
(52) U.S. Cl.
  CPC ..... *H04H 2201/13* (2013.01); *H04H 2201/60* (2013.01)
(58) Field of Classification Search
  USPC ...................................................... 455/150.1
  See application file for complete search history.

(56) References Cited

U.S. PATENT DOCUMENTS

| | | |
|---|---|---|
| 6,628,930 B1 | 9/2003 | Vogt et al. |
| 2003/0119469 A1* | 6/2003 | Karr ....................... H01Q 1/273 455/280 |
| 2007/0183014 A1* | 8/2007 | Coppola ................. H03J 1/005 359/326 |

FOREIGN PATENT DOCUMENTS

| | | | |
|---|---|---|---|
| JP | H02309712 A | 12/1990 | |
| JP | 3009044 B2 * | 2/2000 | |
| JP | 3009044 B2 | 2/2000 | |
| JP | 2007235493 A | 9/2007 | |

* cited by examiner

RECEIVER

FIELD OF THE INVENTION

This invention relates to a receiver, and in particular to a receiver suitable for determining whether a signal has been transmitted on one or more of a range of radio transmission frequencies.

BACKGROUND OF THE INVENTION

There are a number of applications in which it is desired to be able to scan a range of radio transmission frequencies to identify those that are in use (e.g. are being used to transmit signals comprising information) at any given period of time. One receiver device suitable for use in such an application includes an oscillator tuned to a selected frequency controlled by a controller, the oscillator being connected to a suitable antenna. Radio transmissions received by the antenna and transmitted at the frequency to which the oscillator is tuned can thus be received, and hence a discrimination circuit of the receiver device can be used to ascertain whether or not that frequency is in use. By periodically adjusting the frequency to which the oscillator is tuned, a range of radio transmission frequencies can be monitored to ascertain whether or not they are in use. If all that is required is to ascertain whether or not the frequencies are in use, then it will be appreciated that the oscillator need only be tuned to a given frequency for a relatively short period of time, thus scanning of a range of frequencies can be undertaken relatively quickly.

Whilst a receiver device of the type outlined hereinbefore may operate satisfactorily in a number of applications, the time taken in retuning the oscillator before a subsequent frequency can be monitored results in the scanning of a range of frequencies being too slow to meet the requirements of some applications, or may require a reduced number of frequencies to be monitored.

It is an object of the invention, therefore, to provide a receiver in which at least some of the disadvantages associated with known receiver designs are overcome or are of reduced impact.

SUMMARY OF THE INVENTION

According to an aspect of the invention, there is provided a receiver comprising a first oscillator, a second oscillator, a controller operable to control frequencies to which the first and second oscillators are tuned, and a discrimination circuit operable to receive and monitor transmitted signals; wherein the discrimination circuit is configured to receive a signal at a first transmission frequency determined based on a first tuned frequency to which the first oscillator is tuned, and to determine, in a capture time period, whether data is being transmitted at the first transmission frequency; wherein the controller is configured to tune, in a tuning time period, the second oscillator to a second tuned frequency; and wherein the tuning time period is shorter than the capture time period.

Optionally, the controller is configured to tune the second oscillator during the capture time period.

Optionally, after determining whether data is being transmitted at the first transmission frequency, the discrimination circuit is configured to receive signals at a second transmission frequency determined based on the second tuned frequency, and to determine whether data is being transmitted at the second transmission frequency.

Optionally, the discrimination circuit is configured to determine whether data is being transmitted at the second transmission frequency during a further capture time period; wherein the controller is configured to tune, in a further tuning time period, the first oscillator to a third tuned frequency; and wherein the further tuning time period is shorter than the further capture time period.

Optionally, the controller is configured to tune the first oscillator to the third tuned frequency during the further capture time period.

Optionally, the capture time period has the same duration as the further capture time period.

Optionally, the receiver further comprises one or more further oscillators.

Optionally, the receiver further comprises: a first connection connecting the controller to the first and second oscillators; and a second connection configured to connect the discrimination circuit to the first and second oscillators.

Optionally, the second connection comprises a switch configured to connect one of the oscillators to the discrimination circuit, while disconnecting the other oscillators from the discrimination circuit.

Optionally, wherein the controller is configured to control the switch.

According to an aspect of the invention, there is provided a portable device comprising a receiver according to any of the preceding claims.

According to an aspect of the invention, there is provided a method of operating a receiver comprising a first oscillator, a second oscillator, a controller operable to control frequencies to which the first and second oscillators are tuned, and a discrimination circuit operable to receive and monitor transmitted signals, the method comprising: receiving, by the discrimination circuit, a signal at a first transmission frequency determined based on a first tuned frequency to which the first oscillator is tuned; determining, by the discrimination circuit in a capture time period, whether data is being transmitted at the first transmission frequency; and tuning, by the controller in a tuning time period, the second oscillator to a second tuned frequency, wherein the tuning time period is shorter than the capture time period.

According to an aspect of the invention, there is provided a computer program comprising instructions which, when executed on at least one processor, cause the at least one processor to carry out any method disclosed herein.

According to an aspect of the invention, there is provided a carrier containing the computer program mentioned above wherein the carrier is one of an electronic signal, optical signal, radio signal, or non-transitory computer readable storage medium.

According to the present invention there is provided a receiver comprising a first oscillator, a second oscillator, a controller operable to control the frequencies to which the first and second oscillators are tuned, and a discrimination circuit operable to monitor signals received at a transmission frequency to which at least one of the oscillators is tuned to ascertain whether signals are being transmitted on that frequency.

Preferably, an antenna is connected to the first and second oscillators.

In such an arrangement, when the first oscillator is being used to determine whether or not transmissions are being undertaken at the radio frequency to which the first oscillator is tuned, the controller can adjust the operation of the second oscillator to the next desired frequency. Once it has been ascertained whether transmissions are being undertaken on the frequency to which the first oscillator is tuned, the second oscillator can be used in monitoring for transmissions on the frequency to which it is tuned. Whilst the second oscillator is in use, retuning of the first oscillator can be undertaken. It will be appreciated that, in such an arrangement, scanning a range of frequencies can be undertaken quickly as delays which occur during retuning of the oscillators can be reduced or avoided.

If desired, one or more additional oscillators could be provided to further reduce retuning delays and thereby further increase the speed over which a range of frequencies can be scanned.

The receiver may further comprise a switch controlling which of the oscillators is connected to the antenna at any given time. The switch is preferably controlled by the controller. Alternatively, the oscillators may be connected to respective antennas.

The receiver may be a suitable for retrofitting to a signal processing apparatus. Specifically, the signal processing apparatus may be used to block frequencies at which the receiver has detected a signal is transmitted. The receiver may be bolted onto the signal processing apparatus.

The receiver may be portable. The receiver may be portable, and may be retrofitted on a portable signal processing apparatus.

The receiver may be used to detect frequencies from one or more unknown sources. Specifically, the receiver may detect if an unknown source is transmitting a signal on a frequency.

The receiver may be for use in one or more of electronic countermeasures, electronic support measures, or electronic warfare.

The invention also relates to a method of operation of a receiver of the type defined hereinbefore, the method comprising using the discrimination circuit and first oscillator in monitoring for a signal transmitted at a frequency to which the first oscillator is tuned, and whilst using the discrimination circuit and first oscillator in such monitoring, tuning the second oscillator to a different frequency.

The method may further comprise a step of, once monitoring for a signal transmitted at a frequency to which the first oscillator is tuned has been completed, using the discrimination circuit and second oscillator in monitoring for a signal transmitted at the frequency to which the second oscillator is tuned, and whilst using the discrimination circuit and second oscillator in such monitoring, retuning the first oscillator to a different frequency.

BRIEF DESCRIPTION OF THE DRAWINGS

The invention will further be described, by way of example, with reference to the accompanying drawing, FIG. 1, which is a diagrammatic representation of a receiver in accordance with an embodiment of the invention.

DETAILED DESCRIPTION

Figure 1:
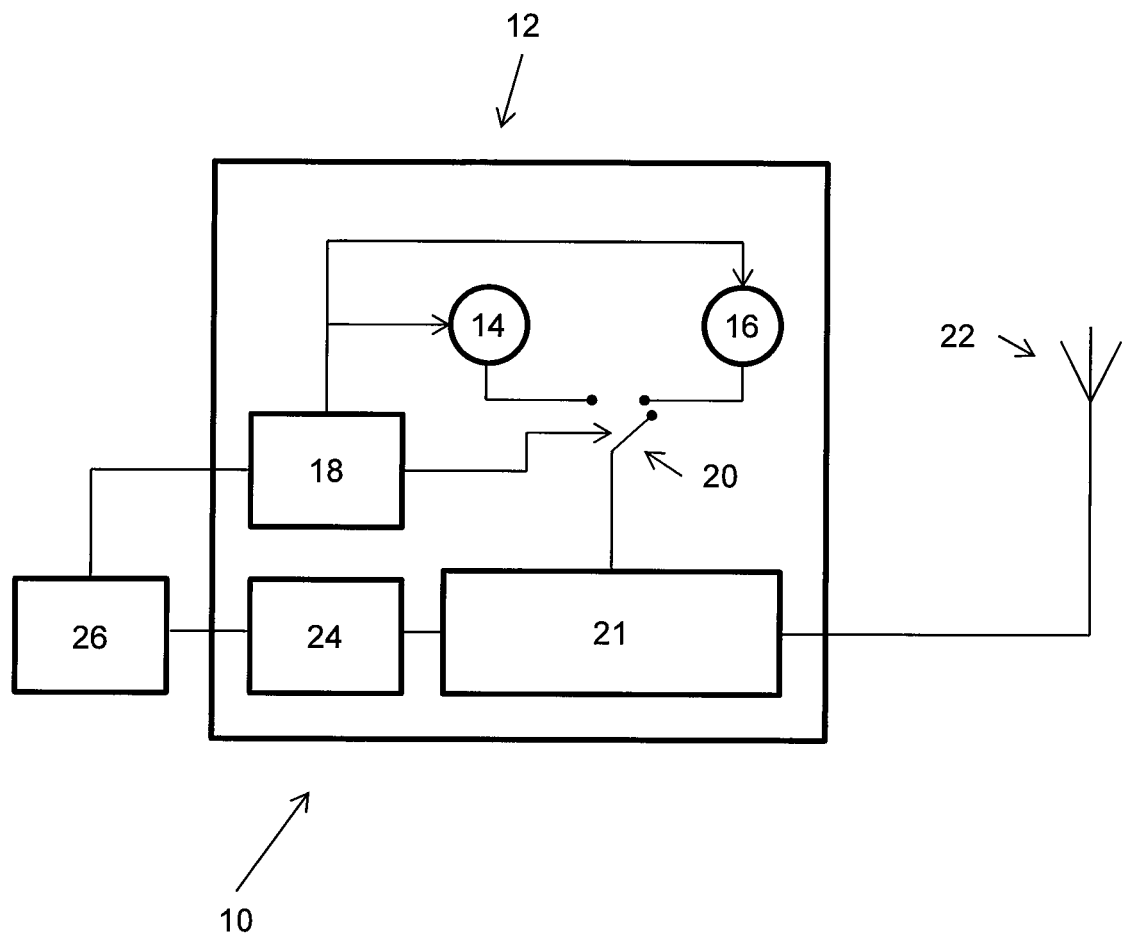

Referring to the accompanying drawing, a receiver 10 is illustrated intended for use in monitoring a range of radio transmission frequencies in order to identify which of the frequencies is in use at any given time. The receiver 10 comprises a unit 12 including a first tuneable oscillator 14 and a second tuneable oscillator 16. The unit 12 further comprises a controller 18 operable to tune the first and second tuneable oscillators 14, 16 to control the frequencies to which they are tuned at any given time. The controller 18 controls the operation of the oscillators 14, 16 such that the oscillators are tuned to respective frequencies.

The oscillators 14, 16 are connected to a switch device 20 which controls which of the oscillators 14, 16 is connected to a receiver circuit 21 to which an antenna 22 is connected, at any given time. The switch device 20 is controlled by the controller 18.

The switch device 20 may be any element capable of selecting one of the first and second oscillators 14, 16 to be connected to the receiver circuit 21. The switch device 20 may be mechanical, electronic or a combination of both, for example.

The unit 12 further comprises a discrimination circuit 24 connected to the receiver circuit 21 and the first and second oscillators 14, 16 and operable to determine whether or not a radio transmission is being received at a particular transmission frequency to which one or other of the oscillators 14, 16 is tuned at any given time. The discrimination circuit 24 provides an output to an output device 26 providing an indication to an operator or a further apparatus, such as a signal processor and/or signal generator, of which, if any, of the frequencies monitored by the device are in use. The manner in which the discrimination circuit 24 operates to achieve this is well known and conventional, and will not be described herein in further detail.

Figure 2:
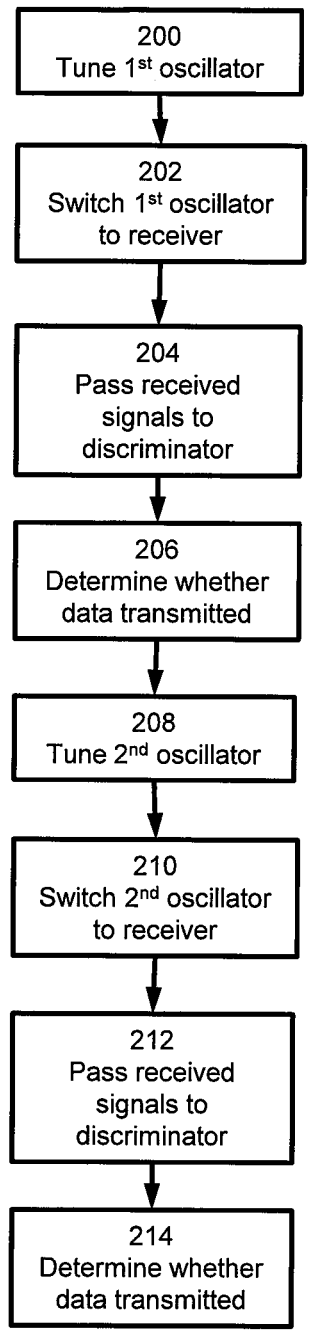
FIG. 2 is a flowchart of an exemplary embodiment of using the receiver of the present invention.

In use and referring to FIG. 2, the controller 18 tunes 200 the first oscillator 14 to operate at a first tuned frequency. The frequency to which the first oscillator is tuned determines a frequency that may be received by the receiver circuit 21 in a way that will be known to the skilled person.

The controller 18 controls 202 the switch device 20 such that the first oscillator 14 is connected to the receiver circuit 21 and antenna 22. The first oscillator 14 therefore determines a first transmission frequency that the receiver 10 is able to receive and monitor.

The receiver unit 21 passes 204 received signals at the first transmission frequency to the discrimination circuit 24, which receives and monitors the signals to ascertain 206 whether or not data is being transmitted at the first transmission frequency. The discriminator circuit 24 may comprise one or more integrated circuits and may employ digital signal processing techniques. Accordingly, the discriminator circuit may comprise a digital signal processor (DSP). The discriminator circuit 24 may therefore comprise an analogue-to-digital converter (ADC) configured to convert the received signals from the receiver unit 21 to digital signals for processing by the discriminator circuit 24.

The discriminator circuit 24 takes an amount of time, a capture time period, to capture and process signals received from the receiver unit 21. In some exemplary arrangements, the capture time period is largely determined by the time taken for the ADC to convert the analogue transmitted signals into a digital signal as that is the part of the process taking the longest time. Therefore, the capture time can be linked to the frequency resolution of the transmission frequency to be analysed as processed by the ADC. Some examples are provided below.

| Frequency Resolution | ADC Capture Time |
|---|---|
| 7.629 kHz (62.5 MHz/8192) | 131.072 µs |
| 15.259 kHz (62.5 MHz/4096) | 65.536 µs |
| 30.518 kHz (62.5 MHz/2048 | 32.768 µs |

The output from the discrimination circuit 24 is provided to the output device 26 to provide an indication to the operator or a further apparatus of whether or not that frequency is in use.

Whilst the discrimination circuit 24 is being used to ascertain whether or not the first transmission frequency is in use (i.e. during the capture time period), the controller 18 tunes 208 the second oscillator 16 to a second tuned frequency, which will determine a second transmission frequency to be monitored. It is noted that whilst step 208 is shown to follow step 208 in order, this should not be considered limiting and in some arrangements the order may be reversed or step 208 may be begun first. Further, it is noted that the steps shown in FIG. 2 may show the start of each step and need not be considered to show completion of that step before the next step begins. The controller 18 takes an amount of time, a tuning time period, to tune the second oscillator 16. The controller 18, the second oscillator and/or the discriminator (e.g. the ADC) are configured such that the tuning time period is less than the capture time period.

Accordingly, when the discrimination circuit 24 has determined whether data is being transmitted at the first transmission frequency set by the first oscillator 14, the controller 18 controls the switch device 20 to disconnect the first oscillator 14 from the receiver circuit 21 and antenna 22, and instead to connect 210 the second oscillator 16 thereto. The discrimination circuit 24 receives 212 and monitors the second transmission frequency to determine 214 whether or not data is being transmitted at the second transmission frequency. Because the tuning time period is less than the capture time period, the discriminator can immediately begin to receive signals at the second transmission frequency without having to wait for retuning.

The discriminator circuit 24 will take an amount of time, a further capture time period, to determine whether data is being transmitted at the second transmission frequency.

The further capture time period is greater than a further tuning time period that is the time taken to retune the first oscillator 14 (described below). In exemplary arrangements the further capture time period frequency is substantially the same as the capture time period.

The discriminator circuit 24 may provide an output to the output device 26 regarding whether or not the second transmission frequency is in use.

Whilst the discrimination circuit 24 is being used to monitor whether or not the second transmission frequency is in use, the controller 18 retunes the first oscillator 14 to a third tuned frequency determining a third transmission frequency to be monitored. Retuning the first oscillator 14 takes an amount of time, a further tuning time period, which is less than the further capture time period. Once monitoring of the second transmission frequency has been completed (i.e. after the further capture time period), monitoring of the third tuned frequency to which the first oscillator 14 is tuned can commence substantially immediately. The controller 18 controls the switch device 20 to disconnect the second oscillator 16 from the receiver circuit 21 and antenna 22 and reconnect the first oscillator 14 thereto.

It will be understood that one or more steps of the above process may be repeated a plurality of times to receive and monitor a plurality (or range) of transmission frequencies By controlling the unit 12 in such a manner that the oscillators 14, 16 are used in turn, retuning the oscillator 14, 16 not 'live' to the next desired frequency whilst the 'live' one of the oscillators 14, 16 is used, in conjunction with the receiver circuit 21 and the discrimination circuit 24, in ascertaining whether or not that frequency is in use, it will be appreciated that a wide range of transmission frequencies can be monitored in a timely manner. The operator or a further apparatus can thus be presented with an indication of which of the frequencies in the range is in use. Depending upon the application in which the invention is used, the operator may use this information to, for example, select which frequency to make transmissions upon or to control, for example, signal jamming equipment to interrupt the transmission of signals on one or more of the frequencies that it has been detected are in use. If desired, the output of the unit 12 may be used directly in controlling the operation of such equipment without requiring user interaction.

It will be appreciated that, in this manner, scanning delays arising through the need to retune an oscillator to the next frequency to be monitored can be reduced or avoided. Scanning of a range of frequencies may thus be undertaken more quickly than with traditional arrangements. Where used in controlling the operation of equipment to transmit a jamming signal to interrupt transmissions on one or more of the detected in use frequencies, it will be appreciated that the disruption of transmissions may occur more rapidly than with traditional scanning techniques, allowing substantially real-time protection over a wide range of frequencies. Further, the use of methods and apparatus disclosed herein allow for the receiver 10 to be fitted to a portable unit due to its light weight. The term "portable" may encompass a battery powered one man lift device.

The oscillators 14, 16 used in the receiver are preferably of a form that permits retuning to be undertaken rapidly. The time it takes for an oscillator to retune may be lower than the sampling time of an Analog-Digital Converter (ADC) of the apparatus converting detected signals. An advantage of keeping the retuning time below the sampling time, is that for the digital signal, the effective retuning time will be zero. The retune time may in some exemplary arrangements actually be limited by the time taken for the controller 18 to switch the switching device 20, which may be in the order of 100 ns. By way of example, each oscillator 14, 16 may have a retuning time of less than 100 μs.

In exemplary arrangements, the radio frequency (RF) of the transmission signals is up to 20 GHz, in a range from 100 kHz to 18 GHz, 10 MHz to 60 MHz and in a particular arrangement from 20 MHz to 520 MHz. The bandwidth of the receiver may be up 10 GHz, up to 500 MHz, up to 100 MHz or up to 50 MHz.

The receiver will retune and use the oscillators in turn, regardless of whether a signal is transmitted on a detected frequency. If one of the oscillators 14, 16 detects a signal at a frequency, an indication may be provided to an operator of the receiver, and/or to an apparatus connected to the receiver. However, the receiver will continue to retune and scan, so that the frequencies are scanned without a delay, regardless of whether a signal is detected by the receiver system.

If the retuning time of each oscillator 14, 16 is sufficiently slow that the use of two oscillators still results in retuning delays occurring, then one or more additional oscillators could be provided, the oscillators being used in sequence, to further reduce net retuning delays.

Rather than provide a suitable controlled switch between the oscillators and the receiver circuit and antenna, each oscillator could be connected to a respective receiver circuit and antenna. In such an arrangement, a suitably controlled switch device may be provided between the oscillators/receiver circuits and the discrimination circuit.

A computer program may be configured to provide any of the above described methods. The computer program may be provided on a computer readable medium. The computer program may be a computer program product. The product may comprise a non-transitory computer usable storage medium. The computer program product may have computer-readable program code embodied in the medium configured to perform the method. The computer program product may be configured to cause at least one processor to perform some or all of the method.

Various methods and apparatus are described herein with reference to block diagrams or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer circuits. These computer program instructions may be provided to a processor circuit of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s).

Computer program instructions may also be stored in a computer-readable medium that can direct a computer or other programmable data processing apparatus to function in a particular manner, such that the instructions stored in the computer-readable medium produce an article of manufacture including instructions which implement the functions/acts specified in the block diagrams and/or flowchart block or blocks.

A tangible, non-transitory computer-readable medium may include an electronic, magnetic, optical, electromagnetic, or semiconductor data storage system, apparatus, or device. More specific examples of the computer-readable medium would include the following: a portable computer diskette, a random access memory (RAM) circuit, a read-only memory (ROM) circuit, an erasable programmable read-only memory (EPROM or Flash memory) circuit, a portable compact disc read-only memory (CD-ROM), and a portable digital video disc read-only memory (DVD/Blu-ray).

The computer program instructions may also be loaded onto a computer and/or other programmable data processing apparatus to cause a series of operational steps to be performed on the computer and/or other programmable apparatus to produce a computer-implemented process such that the instructions which execute on the computer or other programmable apparatus provide steps for implementing the functions/acts specified in the block diagrams and/or flowchart block or blocks.

Accordingly, the invention may be embodied in hardware and/or in software (including firmware, resident software, micro-code, etc.) that runs on a processor, which may collectively be referred to as "circuitry," "a module" or variants thereof.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated.

Whilst one embodiment of the invention is described hereinbefore with reference to the accompanying drawing, it will be appreciated that a wide range of modifications and alterations may be made thereto without departing from the scope of the invention as defined by the appended claims.

The invention claimed is:

1. A receiver comprising a first oscillator, a second oscillator, a controller operable to control frequencies to which the first and second oscillators are tuned, and a discrimination circuit operable to receive and monitor transmitted signals;
   wherein the discrimination circuit is configured to receive a signal at a first transmission frequency determined based on a first tuned frequency to which the first oscillator is tuned, and to determine, in a capture time period of the first oscillator, whether data is being transmitted at the first transmission frequency;
   wherein the controller is configured to tune, in a tuning time period, the second oscillator to a second tuned frequency,
   wherein the discrimination circuit is further configured to receive a signal at a second transmission frequency based on the second tuned frequency and to determine, in a capture time period of the second oscillator, whether data is being transmitted at the second transmission frequency, the second tuned frequency being different to the first tuned frequency,
   wherein the controller is further configured to tune, in a further tuning time period, the first oscillator to a third tuned frequency being different to the second tuned frequency;
   the first and second oscillators being tuned in turn to one another, the second oscillator being tuned to the second tuned frequency during the capture time period of the first oscillator, the first oscillator being subsequently tuned to the third tuned frequency during the capture time period of the second oscillator; and
   wherein each tuning time period is shorter than each capture time period.

2. A receiver according to claim 1, further comprising one or more further oscillators.

3. A receiver according to claim 1, further comprising:
   a first connection connecting the controller to the first and second oscillators; and
   a second connection configured to connect the discrimination circuit to the first and second oscillators.

4. A receiver according to claim 1, wherein the second connection comprises a switch configured to connect one of the oscillators to the discrimination circuit, while disconnecting the other oscillators from the discrimination circuit.

5. A receiver according to claim 4 wherein the controller is configured to control the switch.

6. A portable device comprising a receiver according to claim 1.

7. A method of operating a receiver comprising a first oscillator, a second oscillator, a controller operable to control frequencies to which the first and second oscillators are tuned, and a discrimination circuit operable to receive and monitor transmitted signals, the method comprising:

receiving, by the discrimination circuit, a signal at a first transmission frequency determined based on a first tuned frequency to which the first oscillator is tuned;

determining, by the discrimination circuit in a capture time period of the first oscillator, whether data is being transmitted at the first transmission frequency;

tuning, by the controller in a tuning time period, the second oscillator to a second tuned frequency;

receiving, by the discrimination circuit, a signal at a second transmission frequency based on the second tuned frequency and determining, in a capture time period of the second oscillator, whether data is being transmitted at the second transmission frequency, the second tuned frequency being different to the first tuned frequency; and tuning, by the controller, in a further tuning time period, the first oscillator to a third tuned frequency being different to the second tuned frequency;

the first and second oscillators being tuned in turn to one another, the second oscillator being tuned to the second tuned frequency during the capture time period of the first oscillator, the first oscillator being subsequently tuned to the third tuned frequency during the capture time period of the second oscillator, and wherein each tuning time period is shorter than each capture time period.

8. A computer program product for operating a receiver comprising a first oscillator, a second oscillator, a controller operable to control frequencies to which the first and second oscillators are tuned, and a discrimination circuit operatable to receive and monitor transmitted signals, the computer program product embodied in one or more non-transitory computer readable media having program instructions embodied therein, the program instructions executable by at least one processor to cause the at least one processor to:

receive, by the discrimination circuit, a signal at a first transmission frequency determined based on a first turned frequency to which the first oscillator is tuned;

determine, by the discrimination circuit in a capture time period of the first oscillator, whether data is being transmitted at the first transmission frequency;

tune, by the controller in a tuning time period, the second oscillator to a second tuned frequency;

receive, by the discrimination circuit, a signal at a second transmission frequency based on the second tuned frequency and determining, in a capture time period of the second oscillator, whether data is being transmitted at the second transmission frequency, the second tuned frequency being different to the first tuned frequency; and tune, by the controller, in a further tuning time period, the first oscillator to a third tuned frequency being different to the second tuned frequency;

the first and second oscillator being tuned in turn to one another, the second oscillator being tuned to the second tuned french during the capture time period of the first oscillator, the first oscillator being subsequently tuned to the third tuned frequency during the capture time period of the second oscillator, and wherein each tuning time period is shorter than each capture time period.

* * * * *

UNITED STATES PATENT AND TRADEMARK OFFICE
CERTIFICATE OF CORRECTION

Page 1 of 1

PATENT NO. : 11,626,860 B2
APPLICATION NO. : 16/960109
DATED : April 11, 2023
INVENTOR(S) : Paul Hill, Lee Michael Pomeroy and Richard Harrison It is certified that error appears in the above-identified patent and that said Letters Patent is hereby corrected as shown below:

In the Claims

Column 9, Line 30, change "operatable" to "operable"
Column 10, Line 26, change "french" to "frequency"

Signed and Sealed this
Tenth Day of October, 2023

Katherine Kelly Vidal
*Director of the United States Patent and Trademark Office*